(12) United States Patent
Wei et al.

(10) Patent No.: US 7,723,195 B2
(45) Date of Patent: May 25, 2010

(54) METHOD OF FORMING A FIELD EFFECT TRANSISTOR

(75) Inventors: Andy Wei, Dresden (DE); Thorsten Kammler, Ottendorf-Okrilla (DE); Jan Hoentschel, Dresden (DE); Manfred Horstmann, Duerrroehrsdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 622 days.

(21) Appl. No.: 11/566,287

(22) Filed: Dec. 4, 2006

(65) Prior Publication Data
US 2007/0254441 A1 Nov. 1, 2007

(30) Foreign Application Priority Data
Apr. 28, 2006 (DE) ...................... 10 2006 019 934

(51) Int. Cl.
*H01L 21/336* (2006.01)
(52) U.S. Cl. ...................... 438/299; 438/300; 438/305; 257/E21.433
(58) Field of Classification Search ................ 438/299, 438/300, 303, 305; 257/E21.43, E21.433
See application file for complete search history.

(56) References Cited

U.S. PATENT DOCUMENTS

| 6,653,700 B2 * | 11/2003 | Chau et al. ................. 257/412 |
| 6,902,980 B2 * | 6/2005 | Wang et al. ................. 438/305 |
| 6,908,850 B2 | 6/2005 | Doris et al. ................. 438/630 |
| 6,914,303 B2 * | 7/2005 | Doris et al. ................. 257/350 |
| 2005/0003599 A1 * | 1/2005 | Yeo et al. .................... 438/200 |
| 2005/0090066 A1 | 4/2005 | Zhu et al. .................... 438/300 |
| 2005/0176204 A1 | 8/2005 | Langdo et al. .............. 438/298 |

FOREIGN PATENT DOCUMENTS

WO 2006/011912 2/2006

OTHER PUBLICATIONS

Translated German office action dated Mar. 6, 2007, 4 pages.

* cited by examiner

*Primary Examiner*—Michael Trinh
(74) *Attorney, Agent, or Firm*—Williams, Morgan & Amerson, P.C.

(57) ABSTRACT

A method of forming a field effect transistor comprises providing a substrate comprising a biaxially strained layer of a semiconductor material. A gate electrode is formed on the biaxially strained layer of semiconductor material. A raised source region and a raised drain region are formed adjacent the gate electrode. Ions of a dopant material are implanted into the raised source region and the raised drain region to form an extended source region and an extended drain region. Moreover, in methods of forming a field effect transistor according to embodiments of the present invention, a gate electrode can be formed in a recess of a layer of semiconductor material. Thus, a field effect transistor wherein a source side channel contact region and a drain side channel contact region located adjacent a channel region are subject to biaxial strain can be obtained.

10 Claims, 6 Drawing Sheets

METHOD OF FORMING A FIELD EFFECT TRANSISTOR

BACKGROUND OF THE INVENTION

1. Field of the Invention

The present invention generally relates to the formation of integrated circuits, and, more particularly, to the formation of field effect transistors having a channel region with a specified intrinsic stress to improve the charge carrier mobility.

2. Description of the Related Art

Integrated circuits comprise a large number of individual circuit elements, such as transistors, capacitors and resistors. These elements are connected internally to form complex circuits, such as memory devices, logic devices and microprocessors. The performance of integrated circuits can be improved by increasing the number of functional elements in the circuit in order to increase their functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible.

Field effect transistors are used as switching elements in integrated circuits. They allow control of a current flowing through a channel region located between a source region and a drain region. The source region and the drain region are highly doped. In N-type transistors, the source and drain regions are doped with an N-type dopant. Conversely, in P-type transistors, the source and drain regions are doped with a P-type dopant. The doping of the channel region is inverse to the doping of the source region and the drain region. The conductivity of the channel region is controlled by a gate voltage applied to a gate electrode formed above the channel region and separated therefrom by a thin insulating layer. Depending on the gate voltage, the channel region may be switched between a conductive "on" state and a substantially non-conductive "off" state.

When reducing the size of field effect transistors, it is important to maintain a high conductivity of the channel region in the "on" state. The conductivity of the channel region in the "on" state depends on the dopant concentration in the channel region, the mobility of the charge carriers, the extension of the channel region in the width direction of the transistor and the distance between the source region and the drain region, which is commonly denoted as "channel length." While a reduction of the width of the channel region leads to a decrease of the channel conductivity, a reduction of the channel length enhances the channel conductivity. An increase of the charge carrier mobility leads to an increase of the channel conductivity.

As feature sizes are reduced, the extension of the channel region in the width direction is also reduced. A reduction of the channel length entails a plurality of issues associated therewith. First, advanced techniques of photolithography and etching have to be provided in order to reliably and reproducibly create transistors having short channel lengths. Moreover, highly sophisticated dopant profiles, in the vertical direction as well as in the lateral direction, are required in the source region and in the drain region in order to provide a low sheet resistivity and a low contact resistivity in combination with a desired channel controllability.

In view of the problems associated with a further reduction of the channel length, it has been proposed to also enhance the performance of field effect transistors by increasing the charge carrier mobility in the channel region. In principle, at least two approaches may be used to increase the charge carrier mobility.

First, the dopant concentration in the channel region may be reduced. Thus, the probability of scattering events of charge carriers in the channel region is reduced, which leads to an increase of the conductivity of the channel region. Reducing the dopant concentration in the channel region, however, significantly affects the threshold voltage of the transistor device. This makes the reduction of dopant concentration a less attractive approach.

Second, the lattice structure in the channel region may be modified by creating tensile or compressive strain. This leads to a modified mobility of electrons and holes, respectively. Depending on the magnitude of the strain, a biaxial tensile strain may increase the mobility of electrons in a silicon layer on an insulating substrate or a substrate comprising an insulating layer provided under the silicon layer by up to 300%, and may also increase the hole mobility when above a 30% SiGe equivalent level. The mobility of holes may also be increased by providing a silicon layer having a compressive strain.

A method of forming a filed effect transistor wherein the channel region is formed in a strained silicon layer provided on an insulating layer will be described in the following with reference to FIGS. 1a-1f.

Figure 1A:
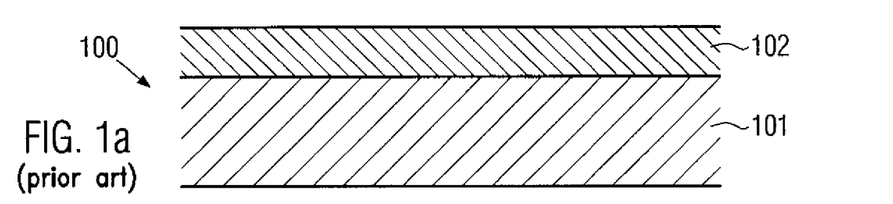
FIGS. 1a-1f show schematic cross-sectional views of a semiconductor structure in stages of a manufacturing process according to the state of the art.

FIG. 1a shows a schematic cross-sectional view of a semiconductor structure 100 in a first stage of the prior art manufacturing process. A substrate 101, which may, for example, comprise a silicon wafer, is provided. On the substrate, a layer 102 of an insulating material is formed, for example by means of known methods of deposition and/or oxidation. In some examples of prior art processes, the layer 102 of insulating material may comprise silicon dioxide.

Figure 1B:
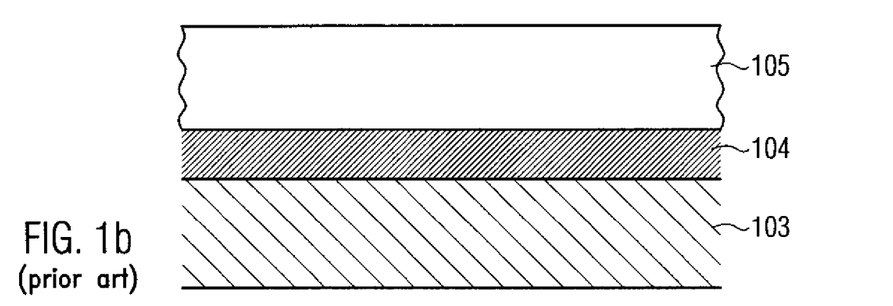

In addition to the substrate 101, an auxiliary substrate 103, which is shown in FIG. 1b, is provided. On the auxiliary substrate 103, a strain-creating layer 104 and a layer 105 of a semiconductor material are formed. This may be done by means of known deposition techniques such as chemical vapor deposition and/or plasma enhanced chemical vapor deposition. The layer 105 of semiconductor material may comprise silicon.

The strain-creating layer 104 comprises a material having a lattice constant other than the lattice constant of the semiconductor material 105. When the semiconductor material of the layer 105 is deposited on the strain-creating layer 104, the crystalline structure of the semiconductor material 105 is influenced by the crystal lattice of the strain-creating layer 104. Thus, a global biaxial strain can be created in the layer 105 of semiconductor material.

If the lattice constant of the material of the strain-creating layer 104 is greater than the lattice constant which the semiconductor material of the layer 105 adopts in a bulk crystal, the atoms in the layer 105 arrange at a greater distance than in a bulk crystal of the semiconductor material. Thus, the layer 105 of semiconductor material comprises a tensile strain. Conversely, if the lattice constant of the material of the strain-creating layer 104 is smaller than that of the semiconductor material of layer 105 in a bulk crystal, the layer 105 of semiconductor material is formed with an intrinsic compressive strain. In examples of prior art processes wherein the layer 105 of semiconductor material comprises silicon, a strain-creating layer 104 comprising an alloy of silicon and germanium may be used to create a tensile strain. In order to create a compressive strain in the layer 105 when comprising silicon, the strain-creating layer 104 may be made of an alloy of silicon and carbon.

Figure 1C:
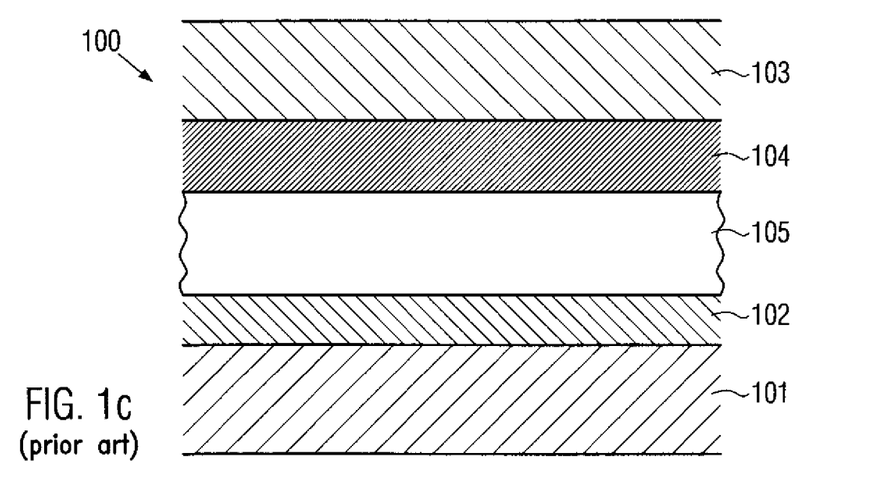

The auxiliary substrate 103 is bonded to the substrate 101. To this end, the auxiliary substrate 103 and the substrate 101 are arranged such that the layer 105 of semiconductor material and the layer 102 of insulating material contact each other, as shown in FIG. 1c. Then, a known bonding technique, such as anodic bonding, is employed to fix the layer 105 of semiconductor material to the layer 102 of insulating material.

Figure 1D:
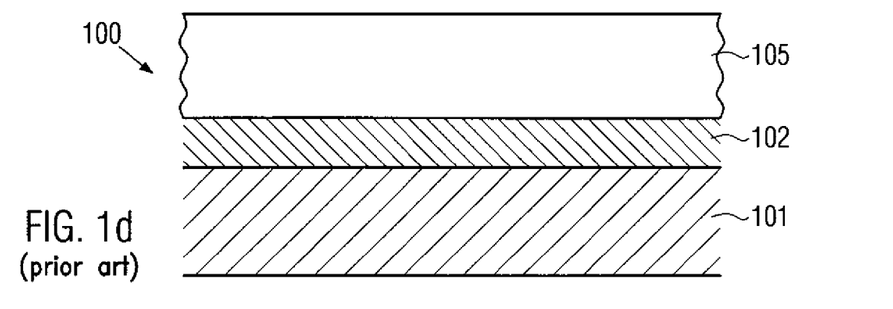

A schematic cross-sectional view of the semiconductor structure 100 in a later stage of the manufacturing process according to the state of the art is shown in FIG. 1d. The auxiliary substrate 103 and the strain-creating layer 104 are removed, for example by means of grinding, etching or delamination. Then, the substrate 101 comprises on its surface the layer 105 of semiconductor material over the layer 102 of insulating material. The biaxial strain in the layer 105 of semiconductor material, which has been induced by the presence of the strain-creating layer 104 in the formation of the layer 105, is substantially preserved after the removal of the strain-creating layer 104. Therefore, the layer 105 of semiconductor material still comprises a biaxial strain.

Figure 1E:
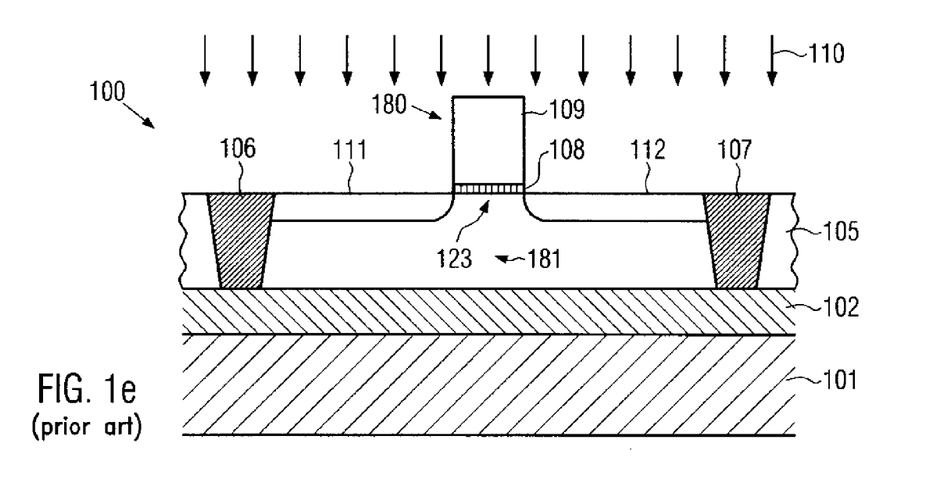

A schematic cross-sectional view of the semiconductor structure 100 in a further stage of the manufacturing process according to the state of the art is shown in FIG. 1e. Shallow trench isolations 106, 107 which may be part of one continuous trench isolation structure are formed in the layer 105 of semiconductor material. The shallow trench isolations 106, 107 and the layer 102 of insulating material insulate a portion of the layer 105 of semiconductor material from the rest of the layer 105. Then, an active region 181 is created in the region between the shallow trench isolations 106, 107, for example by means of a known ion implantation process, wherein ions of a dopant material are introduced into the layer 105 of semiconductor material.

Subsequently, a gate electrode 109, which is separated from the active region 181 by a gate insulation layer 108, is formed over the active region. In the formation of the gate electrode 109 and the gate insulation layer 108, as well as in the formation of the shallow trench isolations 106, 107, techniques known to persons skilled in the art, such as advanced methods of deposition, photolithography, etching and oxidation, may be employed.

After the formation of the gate electrode 109, the semiconductor structure 100 is irradiated with ions 110 of a dopant material, which are indicated by arrows in FIG. 1e. The ions impinge on the layer 105 of semiconductor material and penetrate the layer 105 of semiconductor material. Thus, dopant material is introduced into the layer 105 of semiconductor material to form an extended source region 111 and an extended drain region 112. The gate electrode 109 absorbs ions impinging thereon such that substantially no dopant material is introduced into a channel region 123 below the gate electrode 109. The impact of the ions removes atoms of the semiconductor material in the layer 105 from their sites in the strained crystal lattice. At typical ion doses used in advanced methods of manufacturing a field effect transistor, the semiconductor material in the extended source region 111 and the extended drain region 112 is amorphized.

Figure 1F:
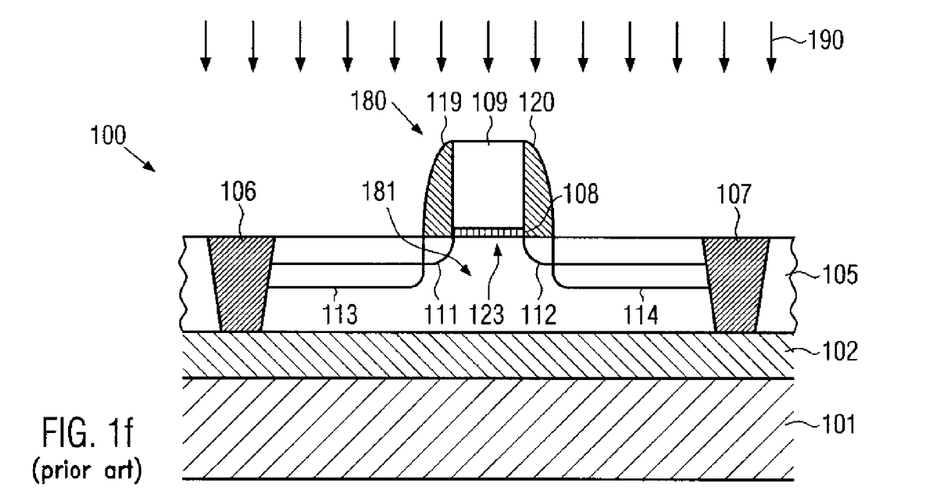

A further stage of the manufacturing process according to the state of the art is shown in FIG. 1f. Sidewall spacers 119, 120 are formed adjacent the gate electrode 109, which may be done by means of well-known methods comprising an isotropic deposition of a layer of a sidewall spacer material and an anisotropic etching process. Then, a further ion implantation, as indicated by arrows 190 in FIG. 1f, is performed to create a source region 113 and a drain region 114. Similar to the formation of the extended source region 111 and the extended drain region 112, the ion implantation into the source region 113 and the drain region 114 may lead to an amorphization of the semiconductor material 105. Finally, an annealing process may be performed to re-crystallize the semiconductor material 105 in the source region 113, the drain region 114, the extended source region 111 and the extended drain region 112.

A problem of the method of forming a field effect transistor according to the state of the art is that the strain-induced enhancement of the mobility of electrons and/or holes in the channel region is significantly reduced at short channel lengths. While in transistors having a relatively large channel length considerably greater than about 50 nm or more, an increase of the drive current by up to 100% may be obtained, in transistors having a relatively short channel length of about 50 nm or less, only an increase of the transistor drive current of about 5-10% is observed.

The present invention is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment of the present invention, a method of forming a field effect transistor comprises providing a substrate comprising a biaxially strained layer of a semiconductor material. A gate electrode is formed on the biaxially strained layer of semiconductor material. A raised source region and a raised drain region are formed adjacent the gate electrode. Ions of a dopant material are implanted into the raised source region and the raised drain region to form an extended source region and an extended drain region.

According to another illustrative embodiment of the present invention, a method of forming a field effect transistor comprises providing a substrate comprising a layer of a semiconductor material. A mask having an opening is formed on the layer of semiconductor material. A recess is formed in a portion of the layer of semiconductor material exposed at a bottom of the opening. On the exposed portion of the layer of semiconductor material, a layer of an insulating material is formed. The opening is filled with a gate electrode material. The mask is selectively removed, wherein at least a portion of the gate electrode material in the opening remains on the substrate to form a gate electrode.

According to yet another illustrative embodiment of the present invention, a semiconductor structure comprises a substrate comprising a layer of a semiconductor material having a biaxial strain and being formed on a layer of an insulating material. A gate electrode is formed over the layer of semiconductor material and a raised source region and a raised drain region are formed adjacent the gate electrode. A source side channel contact region and a drain side channel contact region located adjacent a channel region are subject to the biaxial strain, the channel region being located below the gate electrode.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is generally based on the realization that the loss of charge carrier mobility in the channel region of a field effect transistor formed by means of the method according to the state of the art described above with reference to FIGS. 1a-1f may be caused by a relaxation of the biaxial stress in the layer 105 of semiconductor material which is induced by the amorphization of the semiconductor material occurring in the formation of the source extension 111 and the drain extension 112.

During the formation of the source extension 111 and the drain extension 112, a portion of the ions 110 impinges in the vicinity of the channel region 123 below the gate electrode and pushes atoms away from their sites. Thus, the order of the strained crystal lattice of the layer 105 of semiconductor material is destroyed and the atoms arrange in an amorphous configuration. Thereby, an at least partial relaxation of the biaxial strain occurs. Such relaxation may occur not only in the source extension 111 and the drain extension 112 which are amorphized but also in the vicinity thereof. Similarly, in the formation of the shallow trench isolations 106, 107, the strain in portions of the layer 105 in the vicinity thereof may relax at least partially.

In field effect transistors having a large channel length of considerably more than about 50 nm, the at least partial relaxation of strain occurs only in a small portion of the channel region 123. In advanced field effect transistors having a channel length of about 50 nm or less, however, those portions of the layer 105 of semiconductor material wherein the biaxial strain is relaxed at least partially may comprise a significant portion of the channel region 181, which can lead to the experimentally observed lower charge carrier mobility in such transistors.

In embodiments of the present invention, a source side channel contact region and a drain side channel contact region located adjacent a channel region of a field effect transistor are subject to a biaxial strain of a layer of semiconductor material wherein the channel region and the channel contact regions are formed. Hence, the biaxial strain is provided all around the channel region, such that substantially no relaxation of strain may occur in the channel region. Thus, a reduction of the charge carrier mobility in the channel region may be substantially avoided.

According to some embodiments of the present invention, a raised source region and a raised drain region are formed in the vicinity of the gate electrode of the field effect transistor. In the formation of a source extension and a drain extension of the transistor, ions of a dopant material are implanted into the raised source region and the raised drain region. Thus, an amorphization of the source side channel contact region and the drain side channel contact region and a relaxation of the biaxial strain induced thereby may be substantially avoided. Thus, the biaxial strain in the channel contact regions may be maintained. Thereafter, an annealing process may be performed. In the annealing process, the dopant material may diffuse into the channel contact regions. Since the diffusion of the dopant material can occur without there being a relaxation of strain, the channel contact regions can remain subject to the biaxial strain.

In other embodiments of the present invention, the gate electrode of the field effect transistor can be formed in a recess of a layer of semiconductor material. Thus, the channel region of the field effect transistor which is located below the gate electrode is lowered relative to the surface of the layer of semiconductor material in and on which the field effect transistor is formed. Thus, an amorphization and a corresponding relaxation of strain in the vicinity of the channel region may also be substantially avoided when an ion implantation is performed to form the extended source region and the extended drain region.

Figure 2A:
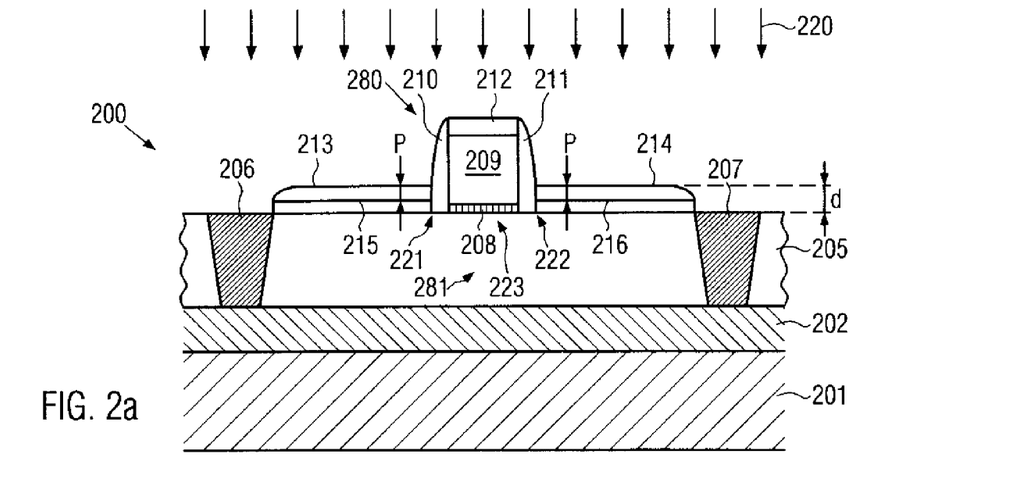
FIGS. 2a-2c show schematic cross-sectional views of a semiconductor structure in stages of a manufacturing process according to an embodiment of the present invention.

In the following, further embodiments of the present invention will be described with reference to FIGS. 2a-2c. FIG. 2a shows a schematic cross-sectional view of a semiconductor structure 200 in a first stage of a manufacturing process according to an embodiment of the present invention. The semiconductor structure comprises a substrate 201. The substrate 201 comprises a layer 202 of an insulating material and a layer 205 of a semiconductor material formed on the layer 202. In the layer 205 of semiconductor material, shallow trench isolations 206, 207 are formed which, together with the layer 202 of insulating material, provide electrical insulation between an active region 281 of a field effect transistor 280 and other portions of the semiconductor structure 200. The layer 205 of semiconductor material may be biaxially strained. Over the active region 281, a gate electrode 209 is formed. A gate insulation layer 208 provides electrical insulation between the gate electrode 209 and the active region 281. The gate electrode 209 is flanked by offset spacers 210, 211 and covered by a cap layer 212.

Similar to the formation of the semiconductor structure 100 by means of the prior art method described above with reference to FIGS. 1a-1f, the formation of the substrate 201 can comprise providing an auxiliary substrate (not shown) on which the layer 205 is formed over a strain-creating layer (not shown). Thus, the layer 205 comprises a biaxial strain.

In some embodiments of the present invention, the layer 205 of semiconductor material can comprise silicon. In such embodiments, a strain-creating layer comprising an alloy of silicon and germanium may be used to create a biaxial tensile strain in the layer 205, whereas a strain-creating layer comprising an alloy of silicon and carbon can be used to create a biaxial compressive strain in the layer 205.

The layer 202 of insulating material is formed on the substrate 201. Thereafter, the auxiliary substrate is bonded to the substrate 201, wherein the layer 205 of semiconductor material contacts the layer 202 of insulating material. This may be done by means of a bonding process known to persons skilled in the art. Then, the auxiliary substrate and the strain-creating layer are removed by means of known methods such that the layer 205 of semiconductor material is exposed on the surface of the substrate 201. Similar to the method according to the state of the art described above, the biaxial strain in the layer 205 is maintained after the removal of the auxiliary substrate and the strain-creating layer.

The shallow trench isolations 206, 207 can be formed by means of known advanced methods of photolithography, etching, deposition and/or oxidation. In the formation of the active region 281, which may be performed after the formation of the shallow trench isolations 206, 207, an ion implantation may be performed to introduce a dopant material into the layer 205 of semiconductor material. Thereafter, the gate insulation layer 208, the gate electrode 209, the offset spacers 210, 211 and the cap layer 212 can be formed using known methods of photolithography, etching, deposition and/or oxidation.

In some embodiments of the present invention, the shallow trench isolations 206, 207, the offset spacers 210, 211 and the cap layer 212 can comprise silicon dioxide, silicon nitride and/or silicon oxynitride. The gate electrode 209 can comprise polysilicon.

A raised source region 213 and a raised drain region 214 are formed adjacent the gate electrode 209. This can be done by means of selective epitaxial growth. Selective epitaxial growth is a variant of plasma enhanced chemical vapor deposition wherein a layer of material is deposited only over exposed portions of the layer 205 of semiconductor material, whereas there is no deposition in portions of the semiconductor structure 200 comprising other materials than the semiconductor material of the layer 205.

In plasma enhanced chemical vapor deposition, which is a process well known to persons skilled in the art, the semiconductor structure 200 is inserted into a reactor. Reactant gases are supplied to the reactor. A radio frequency electric voltage and/or a DC bias voltage are applied to the reactant gases and/or the semiconductor structure 200 to induce a glow discharge wherein reactive precursors are formed from the reactant gases. At the surface of the semiconductor structure 200 and/or in the vicinity thereof, the reactive precursors and/or the reactant gases react chemically with each other. In this chemical reaction, a material is formed which is then deposited on the semiconductor structure 200. Products of the chemical reaction other than the deposited material are removed from the reactor.

The properties of the material layer deposited in plasma enhanced chemical vapor deposition is influenced by parameters such as temperature, pressure, composition of the reactant gas, as well as the electric power supplied via the radio frequency electric voltage and/or the DC bias voltage. In selective epitaxial growth performed in the formation of the raised source region 213 and the raised drain region 214, these parameters are adapted such that material deposition occurs substantially only on portions of the semiconductor structure 200 wherein the semiconductor material of the layer 205 is exposed. The deposited material adapts to the crystal structure of the layer 205 of semiconductor material. Thus, epitaxial growth is obtained.

In embodiments of the present invention wherein the layer 205 of semiconductor material comprises silicon and the shallow trench isolations 206, 207, as well as the cap layer 212 and the offset spacers 210, 211, comprise silicon dioxide and/or silicon nitride, the selective epitaxial growth process may be adapted to selectively deposit silicon on portions of the layer 205 of semiconductor material exposed adjacent the gate electrode 209.

In such embodiments, $SiCl_4$ and $H_2$ can be used as reactants. At growth temperature, these reactants react to silicon and hydrochloric acid. The reaction can proceed in both directions. The etching created in the back-reaction is important in the inhibition of silicon growth on the shallow trench isolations 206, 207 and the cap layer 212 as well as the offset spacers 210, 211.

After the formation of the raised source region 213 and the raised drain region 214, an ion implantation can be performed wherein a beam comprising ions 220 of a dopant material is directed to the semiconductor structure 200. The ions 220 impinge on the surface of the semiconductor structure 200, in particular on the surface of the raised source region 213 and the raised drain region 214. The ions have a speed relative to the raised source region 213 and the raised drain region 214 which depends on the energy of the ions 220. The energy of the ions 220 may be controlled by controlling a voltage which is used to accelerate the ions 220. At least a portion of the ions 220 penetrates the raised source region 213 and the raised drain region 214 and interacts with atoms in the raised source region 213 and the raised drain region 214. Due to this interaction, the ions loose energy. Thus, the ions 220 are decelerated and, finally, stopped. A penetration depth P to which the ions 220 penetrate the raised source region 213 and the raised drain region 214 depends on the energy of the ions 220 as well as the type of ions and the material properties of the raised source region 213 and the raised drain region 214. Thus, the penetration depth P may be controlled by varying one or more of these parameters. In particular, the penetration depth can be controlled by varying the energy of the ions 220. An ion dose applied in the ion implantation can be such that the raised source region 213 and the raised drain region 214 or portions thereof are amorphized.

The penetration depth P of the ions 220 can be equal to or smaller than a depth d of the raised source region 213 and the raised drain region 214. Thus, substantially no ions 220 penetrate the layer 205 of semiconductor material. Therefore, substantially no amorphization of the layer 205 of semiconductor material occurs and substantially no relaxation of the biaxial strain in the layer 205 occurs. Thus, the layer 205 of semiconductor material remains biaxially strained. In particular, a source side channel contact region 221 and a drain side channel contact region 222, which are located below the raised source region 213 and the raised drain region 214, respectively, and adjacent a channel region 223 located below the gate electrode 209, remain biaxially strained.

Figure 2B:
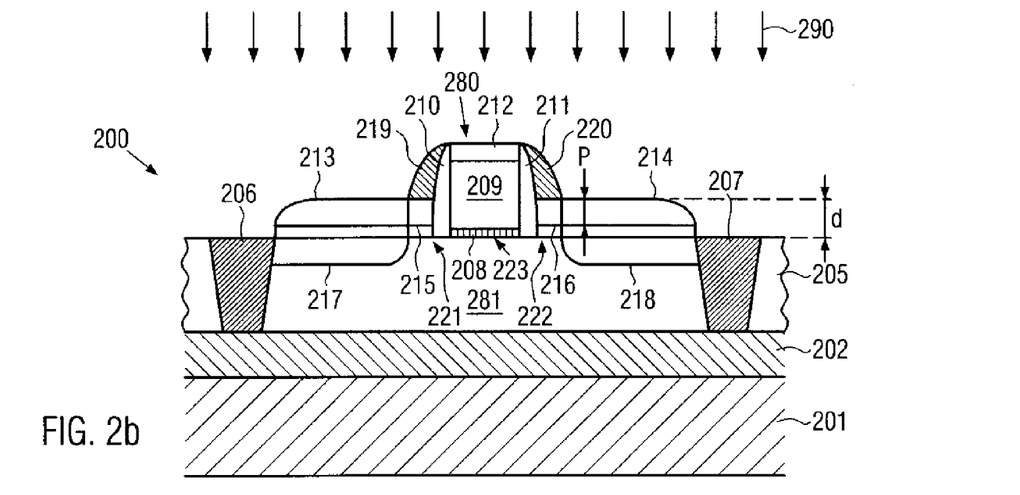

A schematic cross-sectional view of the semiconductor structure 200 in a further stage of the manufacturing process is shown in FIG. 2b. Sidewall spacers 219, 220 are formed adjacent the gate electrode 209. As is well known to persons skilled in the art, this can be done by isotropically depositing a layer of a sidewall spacer material over the semiconductor structure 200 and then performing an anisotropic etch process adapted to selectively remove the sidewall spacer material, wherein an etch rate of substantially horizontal portions of the layer of sidewall spacer material is greater than an etch rate of inclined portions of the layer of sidewall spacer material such as, for example, portions located at the flanks of the gate electrode 209. The etching process is performed until the substantially horizontal portions of the layer of sidewall spacer material are removed. Residues of the layer of sidewall spacer material remaining on the semiconductor structure 200 form the sidewall spacers 219, 220.

Then, a further ion implantation can be performed to form a source region 217 and a drain region 218, as indicated by arrows 290 in FIG. 2b. An energy of ions impinging on the semiconductor structure 200 in the formation of the source region 217 and the drain region 218 can be greater than an energy of ions provided in the formation of the extended source region 215 and the extended drain region 216. Thus, the source region 217 and the drain region 218 obtain a depth which is greater than the penetration depth P of the ions applied in the formation of the extended source region 213 and the extended drain region 214. In some embodiments of the present invention, the depth of the source region 217 and the drain region 218 can be greater than the thickness d of the raised source region 213 and the raised drain region 214. Then, the source region 217 and the drain region 218 overlap the layer 205 of semiconductor material.

The sidewall spacers 219, 220 absorb ions impinging thereon. Thus, the source region 217 and the drain region 218 are spaced apart from the gate electrode 209 and the channel region 208 such that the source region 217 and the drain region 218 do not overlap the source side channel contact region 221 and the drain side channel contact region 222.

An ion dose applied in the formation of the source region 217 and the drain region 218 may be adapted such that the material of portions of the raised source region 213, the raised drain region 214 and the layer 205 of semiconductor material which are exposed to the bombardment of ions is at least partially amorphized. Since, however, the source region 217 and the drain region 218 do not overlap the source side channel contact region 221 and the drain side channel contact region 222, the latter regions are not amorphized. Hence, there is no amorphization of the channel contact regions 221, 222 such that there is no relaxation of strain in the channel contact regions 221, 222. Thus, the channel contact regions 221, 222 remain biaxially strained.

The source region 217 and the drain region 218 need not overlap the layer 205 of semiconductor material. In other embodiments of the present invention, a depth of the source region 217 and the drain region 218 can be smaller than the thickness d of the raised source region 213 and the raised drain region 214. Thus, the source region 217 and the drain region 218 are provided in the raised source region 213 and the raised drain region 214, respectively.

Figure 2C:
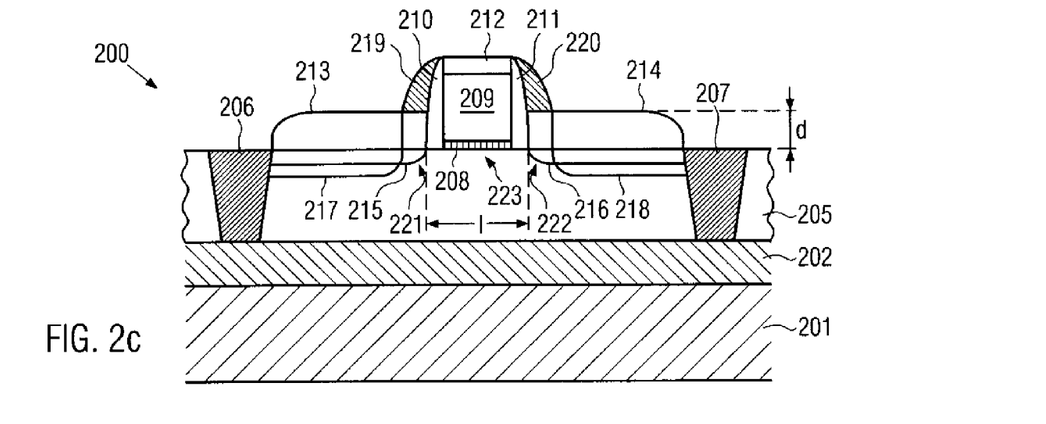

A schematic cross-sectional view of the semiconductor structure 200 in a further stage of the manufacturing process is shown in FIG. 2c. An annealing process can be performed after the formation of the source region 217 and the drain region 218. In the annealing process, the semiconductor structure 200 is exposed to an elevated temperature for a predetermined time. The annealing process may comprise a rapid thermal annealing process known to persons skilled in the art. In other embodiments, the annealing process can comprise inserting the semiconductor structure 200 into a furnace.

In the annealing process, a re-crystallization of the amorphized material in the extended source region 215, the extended drain region 216, the source region 217 and the drain region 218 may occur. In the re-crystallization, the atoms in the amorphized regions re-arrange and assume a crystalline order. Additionally, in the annealing process, the dopant material introduced in the ion implantation is incorporated into the crystal lattice of the semiconductor layer 205 and/or the raised source region 213 and the raised drain region 214 such that dopant atoms may act as electron donors or acceptors.

Furthermore, a diffusion of dopant atoms may occur in the annealing process. Due to diffusion, the dopant distribution in the semiconductor structure 200 is altered. In particular, dopant atoms may leave those portions of the semiconductor structure 200 which were exposed to the ion bombardment in the ion implantation processes and enter neighboring portions of the semiconductor structure 200. In particular, dopant atoms may diffuse into the source side channel contact region 221 and the drain side channel contact region 216 adjacent the channel region 223. Thus, the extended source region 215 and the extended drain region 216, the doping of which is inverse to that of the channel region 223, may grow until they include the source side channel contact region 221 and the drain side channel contact region 222. Dopant diffusion, however, does not substantially alter the biaxial strain of the layer 205 of semiconductor material. Thus, the channel contact regions 221, 222 are doped, but remain biaxially strained.

An annealing process adapted to induce dopant diffusion into the source side channel contact region 221 and the drain side channel contact region 222 need not be performed after the formation of the source region 217 and the drain region 218. In other embodiments of the present invention, such annealing can be performed after the formation of the extended source region 215 and the extended drain region 216. Thus, a diffusion of the dopant material introduced into the extended source region 215 and the extended drain region 216 can be controlled independently of the diffusion of the dopant material introduced into the source region 217 and the drain region 218. Advantageously, this allows a more precise control of the distribution of the dopant material.

As detailed above, the present invention allows the formation of the field effect transistor 280 wherein a relaxation of the biaxial strain of the layer 205 of semiconductor material in the channel region 223 and the adjacent channel contact regions 221, 226 may be substantially avoided or reduced. Thus, a reduction of the charge carrier mobility in these regions and, in particular, in the channel region 223, which is caused by the relaxation of strain, may be reduced compared to a field effect transistor formed by means of the prior art method described above with reference to FIGS. 1a-1f. Therefore, a channel conductivity of the field effect transistor 280 may be advantageously improved.

Figure 3A:
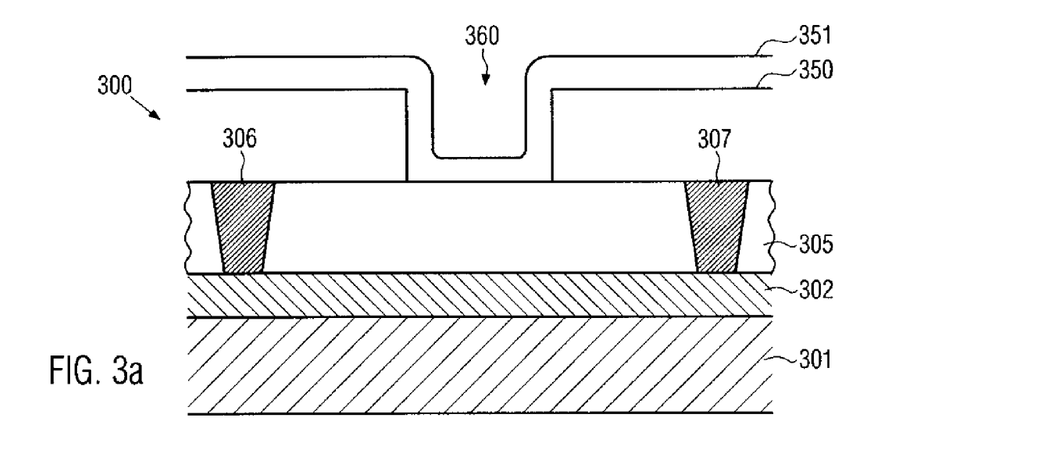
FIGS. 3a-3d show schematic cross-sectional views of a semiconductor structure in stages of a manufacturing process according to another embodiment of the present invention.

Further embodiments of the present invention will be described with reference to FIGS. 3a-3d. FIG. 3a shows a schematic cross-sectional view of a semiconductor structure 300 in a first stage of a manufacturing process according to the present invention. The semiconductor structure 300 comprises a substrate 301. The substrate 301 comprises a layer 302 of insulating material and a layer 305 of semiconductor material formed on the layer 302. In the layer 305 of semiconductor material, shallow trench isolations 306, 307 are formed. The layer 305 of semiconductor material can be biaxially strained.

Similar to the formation of the semiconductor structure 200 described above with reference to FIGS. 2a-2c, the layers 302, 305 and the shallow trench isolations 306, 307 can be formed by means of advanced techniques of deposition, bonding, removal of an auxiliary substrate and a strain-creating layer, photolithography, etching, deposition and/or oxidation.

A mask 350 is formed on the layer 305 of semiconductor material. The mask 350 can comprise a dielectric material, for example silicon dioxide, silicon nitride and/or silicon oxynitride. The formation of the mask 350 can be performed by means of known deposition techniques comprising chemical vapor deposition and/or plasma enhanced chemical vapor deposition.

An opening 360 is formed in the mask 350. This can be done by means of advanced photolithographic techniques well known to persons skilled in the art. The opening 360 is provided between the shallow trench isolations 306, 307 at a location where it is planned to provide a gate electrode of a field effect transistor to be formed in the semiconductor structure 300.

In some embodiments of the present invention, a length of the opening 360 can be reduced. To this end, a material layer 351 is deposited over the semiconductor structure 300 by means of a known deposition process. The deposition process can be isotropic such that a thickness of the material layer 351 over substantially horizontal portions of the mask 350 and the layer 305 of semiconductor material is substantially equal to a thickness of the material layer 351 over inclined portions of the mask 350 such as the sidewalls of the opening 360, wherein the thickness is measured in a direction substantially perpendicular to the surface of the layer 351 at the respective location. The material of the layer 351 can be identical to the material of the mask 350. In other embodiments of the present invention, different materials may be used for the mask 350 and the material layer 351.

Figure 3B:
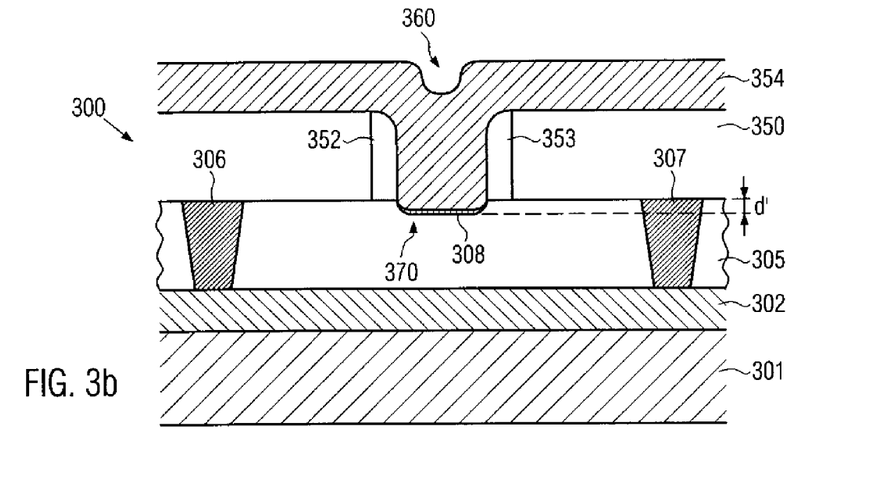

A schematic cross-sectional view of the semiconductor structure 300 in a later stage of the manufacturing process is shown in FIG. 3b. After the deposition of the material layer 351, an anisotropic etching process is performed. In anisotropic etching, an etch rate of the inclined portions of the material layer 351 is smaller than the etch rate of the substantially horizontal portions of the material layer 351. Thus, the horizontal portions of the material layer 351 are removed more quickly than the inclined portions. The etching process can be stopped as soon as the portion of the material layer 351 on the bottom of the opening 360 is removed and the surface of the layer 305 of semiconductor material is exposed at the bottom of the opening 360. Due to the anisotropy of the etching process, portions of the material layer 351 remain at the edges of the opening 360 and form spacing elements 352, 353. Thus, the length of the opening is reduced by the thickness of the spacing elements 352, 353. Advantageously, the reduction of the width of the opening 360 allows the formation of the opening 360 with a length which is smaller than a minimum length which may be obtained by means of photolithographic processes. The present invention, however, is not limited to embodiments wherein the length of the opening 360 is reduced. In other embodiments, the formation of the spacing elements 352, 353 may be omitted.

A recess 370 is formed in a portion of the layer 305 which is exposed at the bottom of the opening. To this end, an etching process can be performed wherein the semiconductor structure 300 is exposed to an etchant adapted to selectively remove the material of the layer 305 of semiconductor material, leaving the mask 350 and the spacing elements 352, 353 substantially intact. In some embodiments of the present invention, the etching process can be anisotropic such that a length of the recess 370 is substantially equal to the length of the opening 360. In other embodiments of the present invention, an isotropic etching process can be performed to form the recess 370. The recess 370 can have a depth d'.

On the bottom of the recess 370, a gate insulation layer 308 is formed on the exposed portion of the layer 305 of semiconductor material which may be done by means of oxidation and/or deposition processes well known to persons skilled in the art.

The opening 360 and the recess 370 are filled with a gate electrode material, for example, polysilicon. To this end, a layer 354 of the gate electrode material is deposited over the semiconductor structure 300, which may be done by means of deposition processes known to persons skilled in the art. Then, the semiconductor structure 300 is planarized, which, in some embodiments of the present invention, can be done by means of a chemical mechanical polishing process.

In chemical mechanical polishing, the semiconductor structure 300 is moved relative to a polishing pad. A slurry is supplied to an interface between the semiconductor structure 300 and the polishing pad. The slurry comprises a chemical compound which reacts with the material on the surface of the semiconductor structure 300, in particular with the gate electrode material and/or the material of the mask 350 and the spacing elements 352, 353. Products of the chemical reaction are removed by means of an abrasive component in the slurry.

In the chemical mechanical polishing process, portions of the layer 354 of gate electrode material located over the mask 350 are removed. Additionally, in some embodiments of the present invention, the chemical mechanical polishing process may remove portions of the mask 350 and a portion of the gate electrode material in the opening 370. Thus, rounded edges of the spacing elements 352 and/or the opening 360 at the top of the opening, as well as a portion of the gate electrode material in the vicinity of the top of the opening 360, having a length greater than the length of the opening 360 at its bottom may be removed.

After the chemical mechanical polishing process, the mask 350 is exposed at the surface of the semiconductor structure 300 and the opening 360 is filled with a plug comprising the gate electrode material.

Figure 3C:
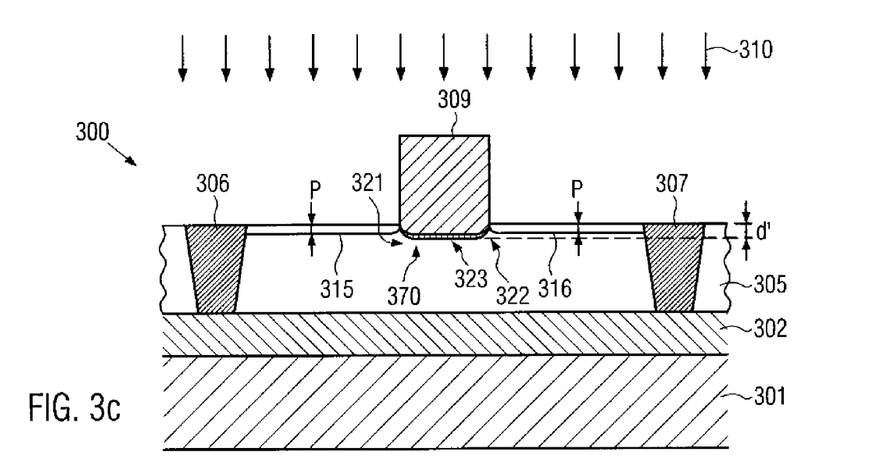

A schematic cross-sectional view of the semiconductor structure 300 in a further stage of the manufacturing process is shown in FIG. 3c. The mask 350 is removed from the semiconductor structure 300. To this end, an etching process may be performed wherein the semiconductor structure 300 is exposed to an etchant adapted to selectively remove the material of the mask 350 and the spacing elements 352, 353, leaving the gate electrode material in the opening 360 substantially intact. Thus, the plug of gate electrode material remains on the surface of the semiconductor structure 300 and forms a gate electrode 309 which has been positioned in the recess 370 in a self-aligned manner. Hence, the bottom of the gate electrode 309 and a channel portion 323 located below the gate electrode 309 in the layer 305 of semiconductor material are recessed relative to the surface of the layer 305 of semiconductor material by the depth d' of the recess 370.

Similar to the embodiments of the present invention described above with reference to FIGS. 2a-2c, an ion implantation process may be performed wherein ions 310 of a dopant material are directed to the semiconductor structure 300 in order to form an extended source region 315 and an extended drain region 316 adjacent the gate electrode 309. The ion implantation process may lead to an at least partial amorphization of the semiconductor material of the layer 305 in the extended source region 315 and the extended drain region 316. A penetration depth P of the ions can be smaller than the depth d' of the recess 370. Thus, a source side channel contact region 321 and a drain side channel contact region 322 which are located in the layer 305 of semiconductor material adjacent the channel region 323 are not irradiated with ions. Hence, the channel contact regions 321, 322 are not amorphized and maintain the biaxially strained lattice structure of the layer 305 of semiconductor material. Hence, there is no relaxation of the strain in the channel contact regions 321, 322 and, thus, no relaxation of the strain in the adjacent channel region 323.

Figure 3D:
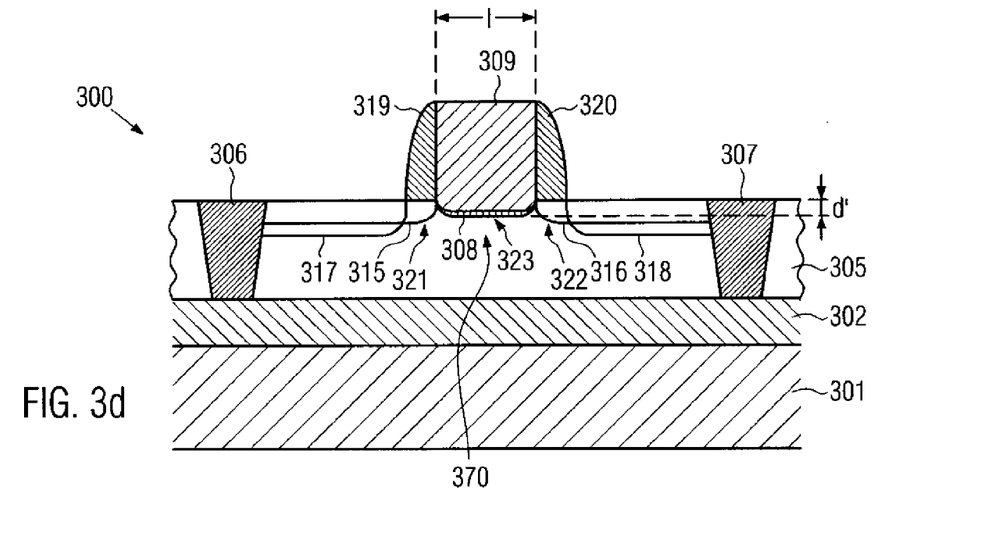

A schematic cross-sectional view of the semiconductor structure 300 in a further stage of the manufacturing process is shown in FIG. 3d. Similar to the embodiments of the present invention described above with reference to FIGS. 2a-2c, sidewall spacers 319, 320 can be formed adjacent the gate electrode 309, and ions of a dopant material may be implanted into the semiconductor structure 300 to form a source region 317 and a drain region 318. Thereafter, an annealing process can be performed to re-crystallize amorphized portions of the layer 305 of semiconductor material in the source region 317, the drain region 318, the extended source region 315 and the extended drain region 316, to activate the dopant material introduced into the layer 305 of semiconductor material and to induce a diffusion of the dopant material into the channel contact regions 321, 322 such that the extended source region 315 includes the source side channel contact region 321 and the extended drain region 316 includes the drain side channel contact region 322.

The diffusion of dopant material substantially does not alter the biaxial strain in the channel contact regions 321, 322. Thus, the source side channel contact region 321 and the drain side channel contact region 322 are formed with a biaxial strain. Hence, there is substantially no relaxation of the biaxial strain in the channel region 323 and, consequently, a reduction of the charge carrier mobility in the channel region 323 can be substantially avoided.

The present invention may be applied in order to form field effect transistors having a channel length (indicated as "l" in FIGS. 3d and 2c) of about 50 nm or less. The present invention, however, is not restricted to such embodiments. In other embodiments of the present invention, the channel length "l" may be more than about 50 nm.

As detailed above, the manufacturing method described above with reference to FIGS. 3a-3d may be used to form a field effect transistor having a strained channel region. In other embodiments of the present invention, however, the layer 305 of semiconductor material need not be biaxially strained.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a field effect transistor, comprising:
   providing a substrate comprising a biaxially strained layer of a semiconductor material;
   forming a gate electrode on said biaxially strained layer of semiconductor material;
   forming a raised source region and a raised drain region adjacent said gate electrode;
   implanting ions of a first dopant material into said raised source region and said raised drain region to form an extended source region and an extended drain region;
   forming spacers adjacent said gate electrode to partially cover said raised source region and said raised drain region after forming said extended source region and said extended drain region;
   implanting ions of a second dopant material into at least said raised source region and said raised drain region using said spacers as an implantation mask to form a source region and a drain region offset from said gate electrode by a distance greater than said extended source region and said extended drain region.

2. The method of claim 1, wherein a penetration depth of said ions of said first dopant material in said implantation is approximately equal to or less than a thickness of said raised source region and said raised drain region.

3. The method of claim 2, further comprising performing an annealing process adapted to induce a diffusion of said first dopant material into a source side channel contact region and a drain side channel contact region, said source side channel contact region and said drain side channel contact region being located adjacent a channel region, said channel region being located below said gate electrode.

4. The method of claim 1, wherein said substrate comprises a layer of an insulating material, said biaxially strained layer of semiconductor material being formed on said layer of insulating material.

5. The method of claim 4, wherein said provision of said substrate comprises:
   providing an auxiliary substrate;
   forming a strain-creating layer on said auxiliary substrate;
   forming said layer of semiconductor material on said strain-creating layer;
   forming said layer of insulating material on said substrate;
   bonding said auxiliary substrate to said substrate, wherein said layer of semiconductor material contacts said layer of insulating material; and
   removing said auxiliary substrate and said strain-creating layer.

6. The method of claim 1, wherein said formation of said raised source region and said raised drain region comprises performing a selective epitaxial growth process.

7. The method of claim 6, further comprising:
   forming a cap layer over said gate electrode; and
   forming sidewall spacers adjacent said gate electrode;
   wherein said formation of said cap layer and said formation of said sidewall spacers is performed before said selective epitaxial growth process.

8. The method of claim 7, wherein at least one of said cap layer and said sidewall spacers comprises silicon nitride.

9. The method of claim 1, wherein a length of said gate electrode is less than about 50 nm.

10. The method of claim 1, further comprising implanting ions of said second dopant material into said substrate to define said source region and said drain region.

* * * * *